US012802947B2

(12) United States Patent
Kikuchi et al.

(10) Patent No.: US 12,802,947 B2
(45) Date of Patent: Nov. 17, 2026

(54) NITRIDE FILM FORMING METHOD AND PLASMA PROCESSING APPARATUS

(71) Applicant: Tokyo Electron Limited, Tokyo (JP)

(72) Inventors: Takamichi Kikuchi, Nirasaki City (JP); Takahiro Shindo, Fuchu City (JP)

(73) Assignee: Tokyo Electron Limited, Tokyo (JP)

( * ) Notice: Subject to any disclaimer, the term of this patent is extended or adjusted under 35 U.S.C. 154(b) by 58 days.

(21) Appl. No.: 18/709,674

(22) PCT Filed: Nov. 4, 2022

(86) PCT No.: PCT/JP2022/041155
§ 371 (c)(1),
(2) Date: May 13, 2024

(87) PCT Pub. No.: WO2023/090168
PCT Pub. Date: May 25, 2023

(65) Prior Publication Data
US 2025/0006471 A1 Jan. 2, 2025

(30) Foreign Application Priority Data
Nov. 19, 2021 (JP) ................................ 2021-188985

(51) Int. Cl.
*H10P 14/694* (2026.01)
*H01J 37/32* (2006.01)
*H10P 14/60* (2026.01)

(52) U.S. Cl.
CPC .. *H01J 37/32697* (2013.01); *H01J 37/32091* (2013.01); *H01J 37/32449* (2013.01);
(Continued)

(58) Field of Classification Search
CPC ........... H01J 37/32697; H01J 37/32091; H01J 37/32449; H01J 2237/332;
(Continued)

(56) References Cited

U.S. PATENT DOCUMENTS 6,335,535 B1 * 1/2002 Miyake ................. H10F 71/121 313/363.1
2016/0225608 A1 * 8/2016 Kelman ............ H01L 21/67207
(Continued)

FOREIGN PATENT DOCUMENTS

JP 2002-541332 A 12/2002
JP 2010-283385 A 12/2010
(Continued)

OTHER PUBLICATIONS

WO-2020121819-A1, machine translation, originally published 2020, p. 1-29 (Year: 2020).*

*Primary Examiner* — Gordon Baldwin
*Assistant Examiner* — Christina D Mcclure
(74) *Attorney, Agent, or Firm* — Armstrong Teasdale LLP

(57) ABSTRACT

A method of forming a nitride film includes: (a) preparing a substrate; (b) supplying a halogen-containing raw material gas into a processing container; (c) supplying a nitrogen-containing gas into the processing container, wherein the nitride film is formed by repeating a cycle including (b) and (c) a set number of times; and (d) reforming the nitride film by supplying a hydrogen-containing gas to the processing container to generate a hydrogen radical by a direct current (DC) pulse voltage, between (b) and (c).

5 Claims, 6 Drawing Sheets

(52) U.S. Cl.
CPC .... *H10P 14/6336* (2026.01); *H10P 14/69433* (2026.01); *H01J 2237/332* (2013.01)

(58) Field of Classification Search
CPC ............. H01J 37/32146; H01J 37/3244; H01J 37/32183; H01J 37/32532; H01L 21/0217; H01L 21/02274; H01L 21/0228; H01L 21/31; H01L 21/02247; H01L 21/67017; C23C 16/455; C23C 16/515; H10P 14/6336; H10P 14/69433; H10P 14/60; H10P 14/6339; H10P 14/6682; H10P 14/6316; H10P 72/0402
See application file for complete search history.

(56) References Cited

U.S. PATENT DOCUMENTS

| | | | | |
|---|---|---|---|---|
| 2018/0342385 | A1* | 11/2018 | Tonegawa ......... | C23C 16/45534 |
| 2019/0385815 | A1* | 12/2019 | Iwashita ........... | H01J 37/32568 |
| 2020/0312654 | A1* | 10/2020 | Ito ..................... | C23C 16/45546 |

FOREIGN PATENT DOCUMENTS

| | | | | |
|---|---|---|---|---|
| JP | 2012-104382 | A | 5/2012 | |
| KR | 10-2019-0141091 | A | 12/2019 | |
| KR | 10-2020-0115160 | A | 10/2020 | |
| WO | WO-2020121819 | A1 * | 6/2020 | ............... H05H 1/46 |

* cited by examiner

| Case | (a) Without hydrogen radical purge | (b) RF application with hydrogen radical purge | (c) DC pulse application with hydrogen radical purge |
| --- | --- | --- | --- |
| RI | 1.91 | 1.95 | 1.94 |
| Stress [MPa] | 991 | −272 | 924 |

FIG. 6

| Case | (a) 1.5T DC200W 310V | (b) 4T DC200W 280V | (c) 4T DC400W 380V |
|---|---|---|---|
| RI | 1.95 | 1.93 | 1.94 |
| Stress [MPa] | −208 | 924 | 725 |

(a) → Shift to compressive stress (b), (c) → Maintenance of tensile stress

NITRIDE FILM FORMING METHOD AND PLASMA PROCESSING APPARATUS

CROSS-REFERENCE TO RELATED APPLICATIONS

The present application is a U.S. National Stage Entry of International Patent Application No. PCT/JP2022/041155, filed Nov. 4, 2022, which claims the benefit of priority to Japanese Patent Application No. 2021-188985, filed Nov. 19, 2021, each of which is hereby incorporated herein by reference in its entirety.

TECHNICAL FIELD

The present disclosure relates to a nitride film forming method and a plasma processing apparatus.

BACKGROUND

For example, Patent Document 1 proposes a method of forming a high-stress silicon nitride film at a low temperature in a batch type apparatus. In Patent Document 1, dichlorosilane is supplied to form a reactant reacted with dichlorosilane on a wafer. Next, hydrogen radicals are supplied to remove chlorine contained in the reactant. Subsequently, ammonia radicals are supplied into a reaction tube to form a silicon nitride film on a substrate W. These processes are repeated multiple times to form a desired silicon nitride film.

PRIOR ART DOCUMENTS

Patent Documents

Patent Document 1: Japanese laid-open publication No. 2010-283385

The present disclosure provides a technique capable of reforming a nitride film while controlling a film stress of the nitride film.

SUMMARY

According to one embodiment of the present disclosure, there is provided a method of forming a nitride film, including (a) preparing a substrate, (b) supplying a halogen-containing raw material gas into a processing container, (c) supplying a nitrogen-containing gas into the processing container, wherein the nitride film is formed by repeating a cycle including (b) and (c) a set number of times, and (d) reforming the nitride film, between (b) and (c), by supplying a hydrogen-containing gas to the processing container to generate a hydrogen radical by a direct current (DC) pulse voltage.

According to the present disclosure, a nitride film may be reformed while controlling a film stress of the nitride film.

BRIEF DESCRIPTION OF DRAWINGS

FIG. 6 is a diagram showing an example of hydrogen radical purge, a film quality of a nitride film, and a film stress.

DETAILED DESCRIPTION

Figure 1:
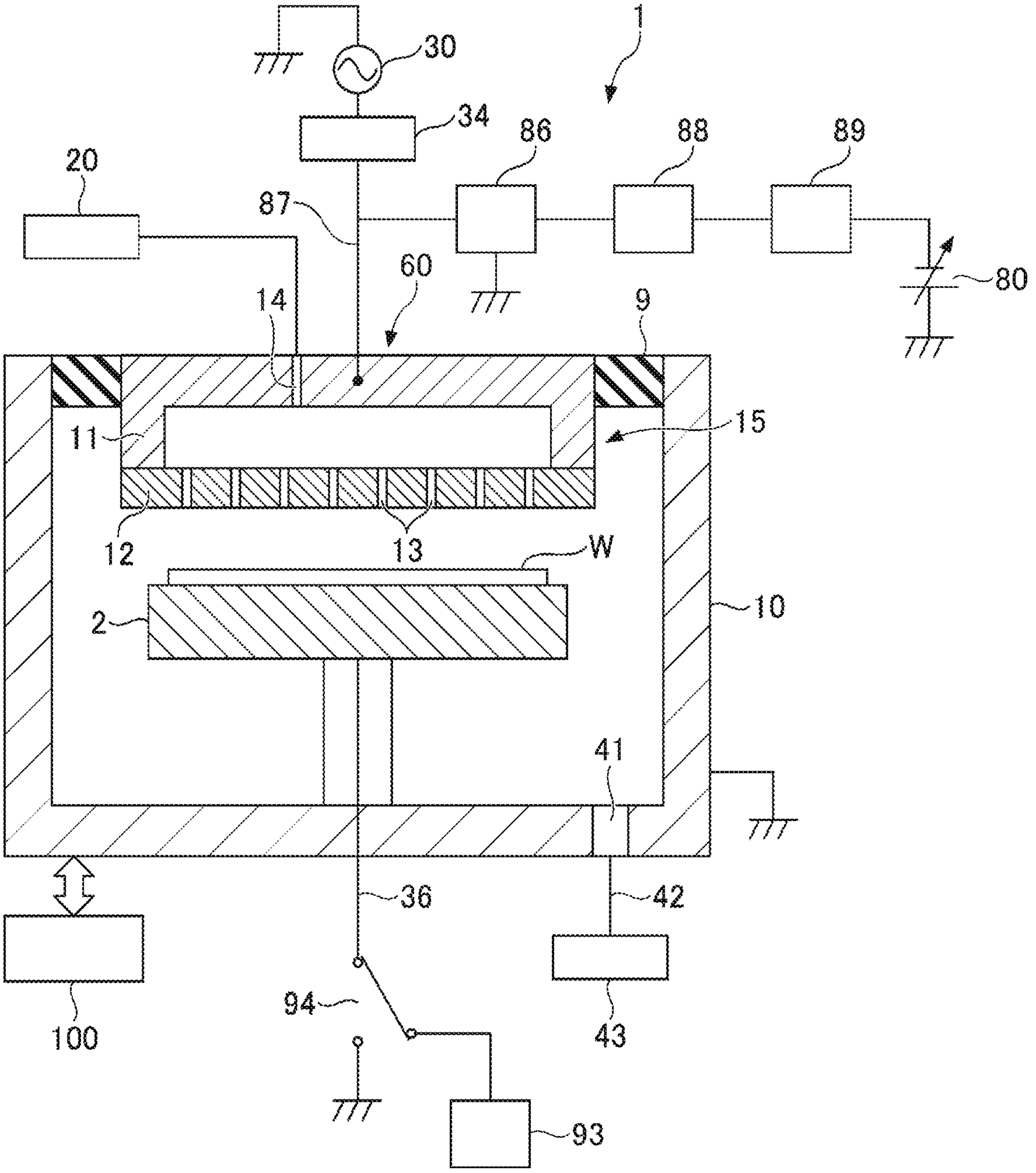
FIG. 1 is a cross-sectional view showing an example of a plasma processing apparatus according to an embodiment.

Embodiments of the present disclosure will now be described in detail with reference to the accompanying drawings. In each drawing, the same components are denoted by the same reference numerals, and a redundant description may be omitted.

[Plasma Processing Apparatus]

First, a configuration example of a plasma processing apparatus 1 according to an embodiment will be described with reference to FIG. 1. The plasma processing apparatus 1 is an example of an apparatus that executes a nitride film forming method according to the embodiment described later. The plasma processing apparatus 1 includes a substantially cylindrical metal processing container 10. The processing container 10 is grounded. A metal stage 2 on which a substrate W is placed is provided inside the processing container 10. The stage 2 also functions as a lower electrode.

The stage 2 may include a heating mechanism, for example, a heater. In addition, a plurality of lifting pins (not shown) are inserted through the stage 2 so as to be protruded and retracted from an upper surface of the stage 2, and the substrate W is delivered to and from the stage by a raising and lowering operation of the plurality of lifting pins by a lifter (not shown).

An opening is formed at an upper portion of the processing container 10, and a shower head 15 is fitted into the opening via an insulating member 9 so as to face the stage 2. The shower head 15 is made of metal, is cylindrical in overall shape, and functions as an upper electrode 60. A part or all of the shower head 15 may be the upper electrode 60. The shower head 15 includes a main body 11 including an opening at a lower portion thereof and a shower plate 12 provided to close the opening of the main body 11. An internal space between the main body 11 and the shower plate 12 serves as a gas diffusion space. A plurality of gas discharge holes 13 are formed at the shower plate 12.

A gas introduction hole 14 is formed at the shower head 15, and a processing gas supplied from a gas supply 20 is introduced into the shower head 15 via the gas introduction hole 14. The processing gas introduced into the shower head 15 is discharged from the gas discharge holes 13 into the processing container 10 and is supplied to a space between the shower head 15 functioning as the upper electrode and the stage 2 functioning as the lower electrode.

The gas supply 20 supplies a plurality of gases, such as a processing gas, a plasma generation gas, and a purge gas, used for plasma processing. An appropriate processing gas is selected as the processing gas depending on plasma processing to be performed. The gas supply 20 includes a plurality of gas supply sources and gas supply pipes that are provided with valves and flow rate controllers such as mass flow controllers.

A radio frequency power source 30 is connected to approximately a center of the shower head 15 via a power supply line 87. The radio frequency power source 30 desirably supplies radio frequency power with a frequency of 400 kHz or higher. By supplying the radio frequency power to the shower head 15 from the radio frequency power source 30, capacitively coupled plasma is generated between the shower head 15 and the stage 2.

The radio frequency power source 30 is connected to the upper electrode 60 via a matching circuit 34 and the power supply line 87. The radio frequency power source 30 supplies a radio frequency voltage that contributes to plasma generation to the upper electrode 60 via the matching circuit 34. The radio frequency voltage is prevented from being propagated toward a variable direct current (DC) power source 80 by a filter 86. The matching circuit 34 matches impedance of the radio frequency power source 30 and impedance of a load (mainly an electrode, plasma, or a processing container).

An output terminal of the variable DC power source 80 is connected to a pulse generator 89, and the variable DC power source 80 outputs a negative DC voltage to the pulse generator 89. The pulse generator 89 generates a DC pulse voltage by using the negative DC voltage inputted from the variable DC power source 80 and supplies the generated DC pulse voltage to the upper electrode 60 via a voltage limiter 88 and the filter 86. The DC pulse voltage periodically repeats an ON state during which a negative DC voltage is applied to the upper electrode 60 and an OFF state during which a DC voltage applied to the upper electrode 60 is approximately 0 V. When plasma is excited by continuously applying the negative DC voltage to the upper electrode 60, abnormal discharge (arcing) is likely to occur. On the other hand, when a negative DC pulse voltage is applied to the upper electrode 60, discharge occurs intermittently and thus occurrence of abnormal discharge is suppressed as compared with the case in which the negative DC voltage is continuously applied. However, in applying the DC pulse voltage, if a voltage of the upper electrode 60 swings significantly to a positive voltage due to an overshoot when transitioning from the on state to the off state, energy of ions incident on the substrate W increases.

The voltage limiter 88 serves to generate plasma by propagating a negative voltage to the upper electrode 60 while the DC pulse voltage is in the on state and suppress a significant swing of the voltage of the upper electrode 60 to a positive voltage due to an overshoot while the DC pulse voltage is in the off state. For example, an overshoot voltage is suppressed to 100 V or less. Then, an increase in plasma potential generated in a processing space is suppressed. On the other hand, since the stage 2 facing the upper electrode 60 is grounded, potential of the placed substrate W is also fixed at 0 V. Although a potential difference between the substrate W and the plasma potential becomes an accelerating voltage of ions, since an increase in the plasma potential is suppressed to 100 V or less by the voltage limiter 88, the accelerating voltage of the ions is also suppressed, and as a result, the energy of ions incident on the substrate W is reduced. When a film is formed at an ion energy of 100 eV or less, a stress of the film may be maintained as a tensile stress. In order to set the ion energy incident on the substrate W to 100 eV or less, the overshoot voltage may be set to 100 V or less. That is, by controlling the overshoot voltage to 100 V or less using the voltage limiter 88, the energy of the ions incident on the substrate W is reduced to 100 e V or less, and the stress of the film on the substrate W may be maintained as the tensile stress.

Figure 2:
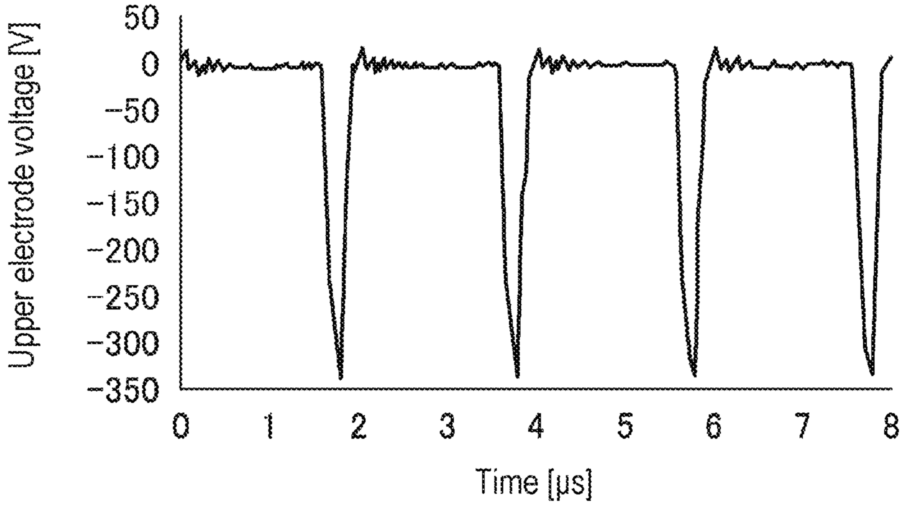
FIG. 2 is a diagram showing an example of a direct current pulse voltage according to the embodiment.

An example of the DC pulse voltage according to the embodiment is shown in FIG. 2. In FIG. 2, the horizontal axis denotes time, and the vertical axis denotes the voltage of the upper electrode 60. The DC pulse voltage supplied to the upper electrode 60 repeats the on state and the off state at a predetermined duty ratio. When transitioning from the on state to the off state, overshoot of the DC pulse voltage is suppressed by functioning of the voltage limiter 88, and the DC pulse voltage is controlled to be 100 V or less. In FIG. 2, the overshoot is suppressed to about 20 V.

A frequency of the DC pulse voltage is desirably 10 kHz to 1 MHz, and the duty ratio is desirably 10% to 90%.

Returning to FIG. 1, an exhaust port 41 is provided at a bottom of the processing container 10. An exhauster 43 is connected to the exhaust port 41 via an exhaust pipe 42. The exhauster 43 exhausts an inside of the processing container 10.

A switch 94 is provided between the stage 2 and a ground via a power supply line 36 and switches connection of the stage 2 to the ground or to an impedance adjusting circuit 93. The impedance adjusting circuit 93 uses resonance of an LC circuit to control a radio frequency from the radio frequency power source 30 so that the radio frequency efficiently flows from the upper electrode 60 to the stage 2.

A controller 100 controls individual operations of respective components in the plasma processing apparatus 1 (e.g., the exhauster 43, the radio frequency power source 30, the variable DC power source 80, the gas supply 20, the heating mechanism, etc.) and an entire operation (sequence) of the plasma processing apparatus 1. The controller 100 is realized by, for example, a microcomputer.

[Nitride Film Forming Method]

Figure 3:
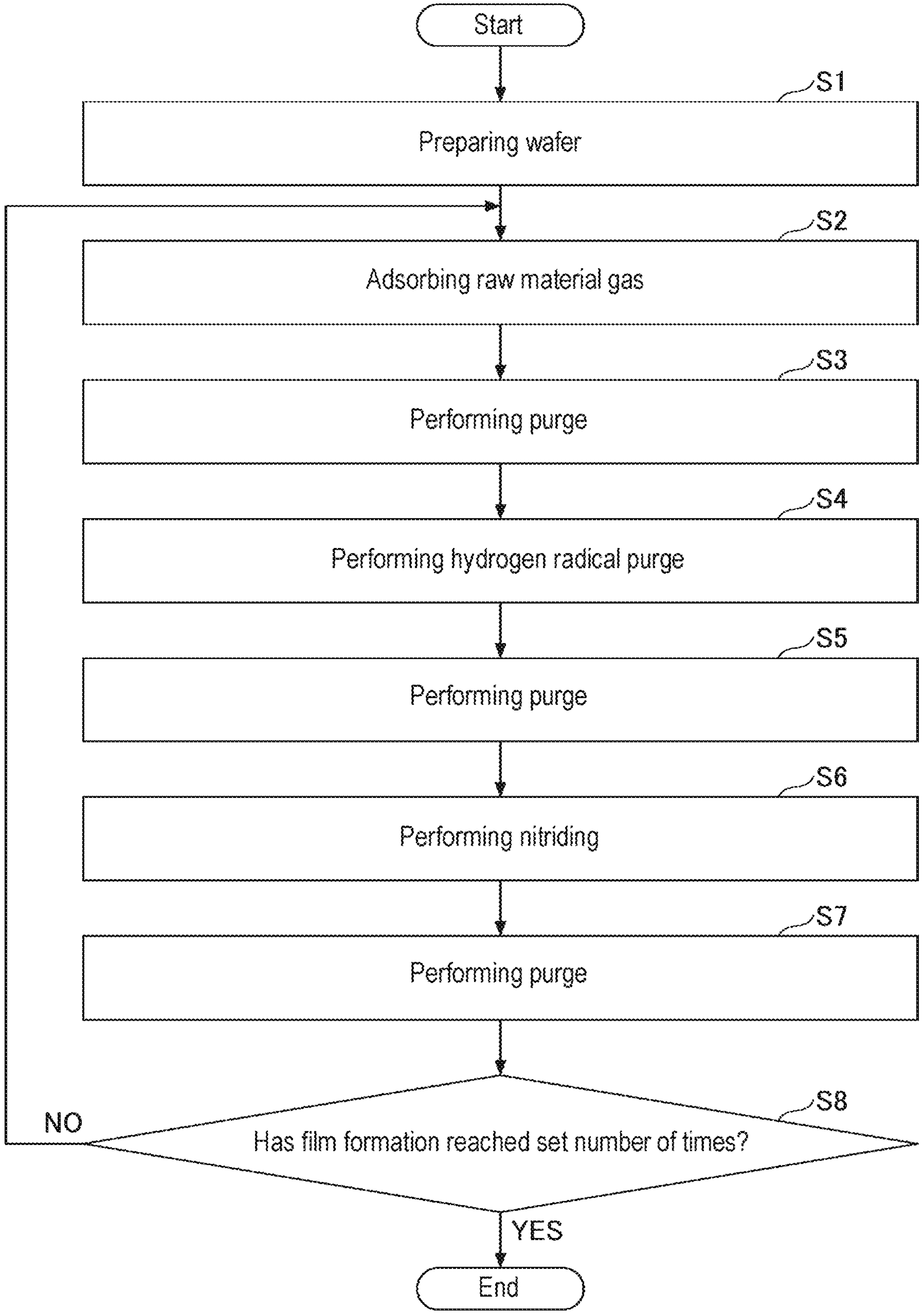
FIG. 3 is a flowchart showing a nitride film forming method according to the embodiment.
Figure 4:
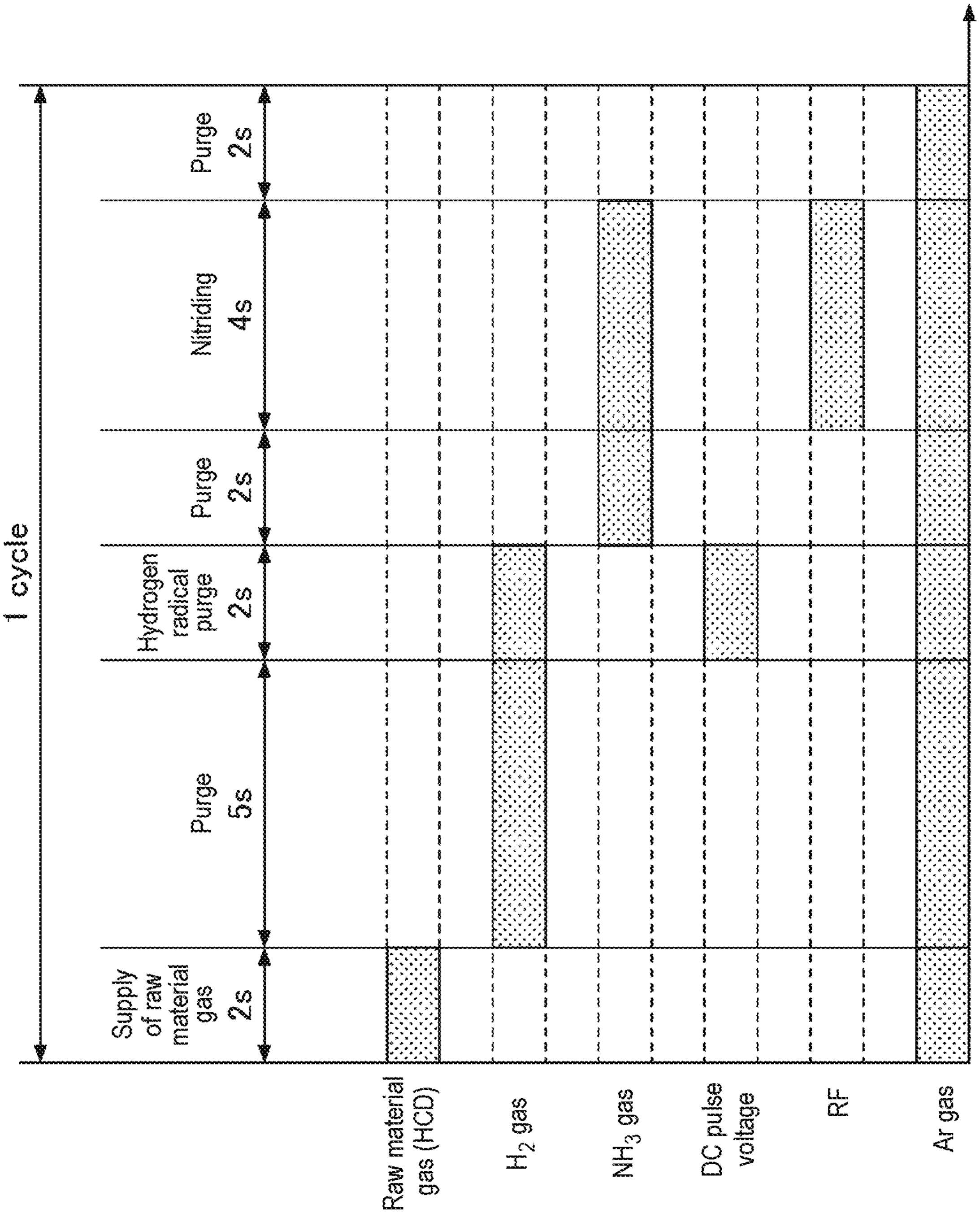
FIG. 4 is a time chart showing the nitride film forming method according to the embodiment.

Next, a nitride film forming method that is executable using the plasma processing apparatus 1 will be described with reference to FIGS. 3 and 4. FIG. 3 is a flowchart showing a nitride film forming method according to the embodiment. FIG. 4 is a time chart showing the nitride film forming method according to the embodiment. The film forming method shown in FIG. 3 is executed by the controller 100.

When processing in FIG. 3 is started, in step S1, the controller 100 allows the substrate W to be loaded into the processing container 10 and to be placed on the stage 2.

Next, as shown in step S2 of FIG. 3 and FIG. 4, a raw material gas, which is a film forming raw material, and an argon (Ar) gas are supplied to the processing container 10 from the gas supply 20 at a predetermined flow rate and a pressure in the processing container 10 is adjusted to a set value by the exhauster 43. Further, by switching the switch 94, the stage 2 is connected to the ground via the switch 94 and the power supply line 36. The Ar gas is constantly supplied while steps S2 to S7 shown in FIG. 3 are performed.

In this way, in step S2 of FIG. 3, the controller 100 supplies the raw material gas to adsorb the raw material gas onto the substrate W. For example, when forming a silicon nitride film, a halogen-containing raw material gas is supplied as the raw material gas to adsorb the halogen-containing raw material gas onto the substrate. As the halogen-containing raw material gas, a silicon (Si) compound containing chlorine (Cl) may be used. In the present disclosure, hexachlorodisilane (HCD; $Si_2Cl_6$) will be described as an example of the raw material gas. Other examples of the raw material gas include dichlorosilane (DCS; $SiH_2Cl_2$), monochlorosilane (MCS; $SiH_3Cl$), trichlorosilane (TCS; $SiHCl_3$), silicon tetrachloride (STC; $SiCl_4$), and the like. However, the raw material gas is not limited thereto, and a silicon compound containing iodine (I) or bromine (Br) may be used as the halogen-containing raw material gas. Further, the raw material gas is not limited to silicon and may be a halogen-containing germanium (Ge) compound.

After a predetermined time has passed from start of step S2, the controller 100 stops supplying the raw material gas as shown in FIG. 4 and supplies a mixed gas of an Ar gas and a $H_2$ gas as a purge gas in step S3 of FIG. 3. However, the purge gas is not limited thereto, and an Ar gas, a $H_2$ gas, a $N_2$ gas, a mixed gas of an Ar gas and a $N_2$ gas, a mixed gas of a $H_2$ gas and a $N_2$ gas, etc. may be used. As a result, the raw material gas in the processing container 10 is replaced with an Ar gas and a $H_2$ gas. Further, a surface of the substrate W is purged with the Ar gas and the $H_2$ gas, thus removing excess molecules of the raw material gas adhering to the surface of the substrate W. The purge gas such as the Ar gas and the $H_2$ gas and a nitrogen-containing gas described below may be supplied from a gas supply pipe, which is not shown, disposed near the substrate W.

After a predetermined time has elapsed from start of step S3, the controller 100 supplies the DC pulse voltage from the variable DC power source 80 to the upper electrode 60 in step S4 while continuing to supply the $H_2$ gas and the Ar gas.

The $H_2$ gas is formed into plasma in a plasma generation space to generate a hydrogen radical. The hydrogen radical reaches the substrate W in the processing container 10. Then, chlorine contained in HCD ($Si_2Cl_6$) adsorbed onto the substrate W reacts with hydrogen, and thus, chlorine is replaced with hydrogen. Si—Cl is replaced with Si—H and a silicon-containing film is reformed. In the present disclosure, while the $H_2$ gas has been exemplified as an example of a hydrogen-containing gas that generates the hydrogen radical, the hydrogen-containing gas is not limited thereto.

After a predetermined time has elapsed from start of step S4, as shown in FIG. 4, supply of the DC pulse voltage from the variable DC power source 80 is stopped, and supply of the $H_2$ gas is stopped. In addition, supply of the Ar gas is continued. In step S5, the controller 100 starts supplying an $NH_3$ gas. Thereby, the hydrogen gas in the processing container 10 is replaced with the Ar gas and the $NH_3$ gas.

After a predetermined time has elapsed from the start of step S5, in step S6, the controller 100 continues to supply the Ar gas, and the $NH_3$ gas as an example of the nitrogen-containing gas into the processing container 10 and converts the switch 94 for the stage 2 and the impedance adjusting circuit 93 to be connected to each other. In addition, the controller 100 supplies the radio frequency voltage from the radio frequency power source 30 to the upper electrode 60. As a result, plasma of the $NH_3$ gas is generated. The plasma of the $NH_3$ gas reacts with the silicon-containing film, where the HCD adsorbed onto the substrate W is reformed by the hydrogen radical, leading to the nitriding of the film. Thereby, a nitrogen concentration in the silicon-containing film may increase to thus form a silicon nitride film. The nitrogen-containing gas is not limited to the $NH_3$ gas and nitrogen ($N_2$), diazene ($N_2H_2$), hydrazine ($N_2H_4$), and an organic hydrazine compound such as monomethylhydrazine ($CH_3(NH)NH_2$) may be used. In step S6, the radio frequency voltage from the radio frequency power source 30 may not be supplied.

After a predetermined time has elapsed from start of step S6, as shown in FIG. 4, supply of the $NH_3$ gas is stopped, supply of the radio frequency voltage from the radio frequency power source 30 is stopped, and the stage 2 is connected to the ground by the switch 94. In step S7, the controller 100 continues to supply the Ar gas. As a result, the $NH_3$ gas in the processing container 10 is replaced with the Ar gas. Herein, the purge gas is not limited to the Ar gas and may also be a $H_2$ gas, a $N_2$ gas, a mixed gas of a $H_2$ gas and an Ar gas, a mixed gas of an Ar gas and a $N_2$ gas, or a mixed gas of a $H_2$ gas and a $N_2$ gas.

After a predetermined time has elapsed from start of step S7, in step S8, the controller 100 determines whether a film forming process for a nitride film has been performed a predetermined set number of times by setting the film forming process (steps S2 to S7) as one cycle (one time). If the controller 100 determines that the film forming process has not been performed the set number of times, processing returns to step S2 to execute one cycle of steps S2 to S7. As a result, the film forming process of the silicon nitride film is repeated. By repeating the film forming process the set number of times, the silicon nitride film of a predetermined thickness is formed. If the controller 100 determines that the film forming process has been performed the set number of times, the controller 100 unloads the substrate W and ends processing.

For example, as shown in FIG. 4, raw material gas adsorption of step S2 is performed for 2 seconds, step S3 is performed for 5 seconds, hydrogen radical purge of step S4 is performed for 2 seconds, step S5 is performed for 2 seconds, nitridation of step S6 is performed for 4 seconds, and step S7 is performed for 2 seconds. Thereby, a silicon nitride film of a good film quality may be formed on the surface of the substrate W. Herein, implementation times of steps S2 to S7 are not limited to the above example.

According to the method of forming the nitride film described above, the DC pulse voltage is supplied between the raw material gas adsorption of step S2 and the nitridation of step S6, and the hydrogen radical purge of step S4 that generates the hydrogen radical is performed. Therefore, the silicon nitride film is reformed. By performing the hydrogen radical purge of step S4 after supplying the chlorine-containing silicon raw material gas of step S2 and before the nitridation of step S6, the silicon nitride film with the best film quality may be formed.

However, the hydrogen radical purge of step S4 may be performed at any time as long as step S4 is performed between step S2 and step S6. For example, the hydrogen radical purge of step S4 may be performed after the nitridation of step S6 is performed and before the raw material gas adsorption is performed as next step S2.

Further, according to the nitride film forming method described above, as a result of performing processing of step S2, step S4, and step S6 the set number of times (one or more times), a stress of the silicon nitride film formed is a tensile stress. When forming the silicon nitride film, the film stress is one of important indicators for evaluating a film quality. For example, in the case of the silicon nitride film, a desirable film stress is generally a tensile stress. When the silicon nitride film is formed without performing the hydrogen radical purge (S4 and S5 of FIG. 3 are omitted), the film stress is generally the tensile stress. It is desirable to maintain the tensile stress even if a film is reformed by the hydrogen radical purge.

In a conventional nitride film forming method, the silicon nitride film may be formed on the substrate W by performing hydrogen radical purge using capacitively coupled plasma. In this case, by irradiating the substrate W with high-energy ions, the stress of the silicon nitride film shifts from the tensile stress to a compressive stress. There is a strong correlation between the film stress and an ion energy in plasma irradiation during hydrogen radical purge, and even when hydrogen radical purge is performed by suppressing the ion energy, the film stress of the silicon nitride film formed on the substrate W may be turned into the tensile stress.

As a method of suppressing the ion energy, increasing a frequency of a radio frequency supplied from the radio frequency power source 30 (higher frequency) may be considered. However, in order to achieve a higher frequency of the radio frequency voltage, there are problems in terms of changes in hardware specifications, such as a radio frequency power source, or costs.

Therefore, in the film forming method of the present disclosure, the radio frequency voltage is not supplied from the radio frequency power source 30 to the upper electrode 60 in step S4 of the hydrogen radical purge, and the DC pulse voltage having an overshoot value of 100 V or less to a positive voltage side is supplied from the variable DC power source 80. By supplying a negative DC pulse voltage instead of the radio frequency voltage, the ion energy in plasma irradiation may be reduced. Furthermore, by controlling the DC pulse voltage not to exceed a positive value of 100 V using the voltage limiter 88, plasma with a low ion energy may be generated. That is, when the DC pulse voltage with the overshoot value of 100 V or less to the positive voltage side is supplied, hydrogen plasma of a lower ion energy than hydrogen plasma generated by supplying the radio frequency voltage from the radio frequency power source 30 may be generated. Furthermore, hydrogen plasma of a high radical density that is capable of reforming the silicon nitride film, equivalent to supply of the radio frequency voltage from the radio frequency power source 30, may be generated. Thereby, the silicon nitride film may be reformed while maintaining the tensile stress.

As described above, according to the film forming method of the present disclosure, since hydrogen plasma of a low ion energy and a high radical density is possible to be generated by supplying the DC pulse voltage, the silicon nitride film of a good film quality with the tensile stress may be formed.

The stage 2 of the plasma processing apparatus 1 is an example of a first electrode on which the substrate is placed in the processing container 10, and the upper electrode 60 is an example of a second electrode facing the first electrode. The variable DC power source 80 and the pulse generator 89 are an example of a power source system that supplies the DC pulse voltage to the second electrode.

[Experimental Results]

Figure 5:
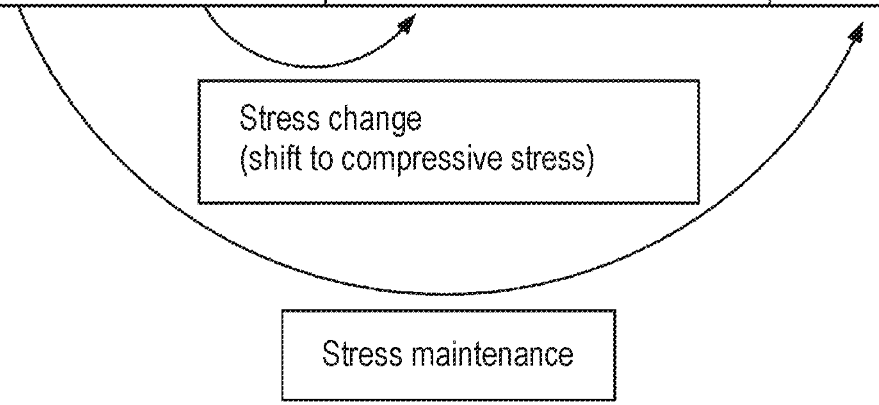
FIG. 5 is a diagram showing an example of hydrogen radical purge, a film quality of a nitride film, and a film stress.

An experiment is conducted on film characteristics of the silicon nitride film formed by the film forming method according to the embodiment of FIG. 3 using the plasma processing apparatus 1. Experimental results will now be described with reference to FIGS. 5 and 6. FIGS. 5 and 6 are diagrams showing examples of a relationship between hydrogen radical purge, a film quality (refractive index) of a nitride film, and a film stress.

Case (a) of FIG. 5 shows a state of a silicon nitride film when step S4 (hydrogen radical purge) of FIG. 3 is not performed. Case (b) of FIG. 5 shows a state of a silicon nitride film when hydrogen radical purge is performed by supplying a radio frequency voltage from the radio frequency power source 30. Case (c) of FIG. 5 shows a state of a silicon nitride film when hydrogen radical purge is performed by supplying a DC pulse voltage from the variable DC power source 80. Case (c) of FIG. 5 shows an evaluation of the film quality and the film stress of the silicon nitride film formed by the nitride film forming method according to the embodiment shown in FIG. 3. Case (b) of FIG. 5 is a reference example showing an evaluation of a film quality and a film stress of the silicon nitride film when the hydrogen radical purge is performed by supplying the radio frequency voltage from the radio frequency power source 30.

Processing conditions for the hydrogen radical purge of the reference example shown in case (b) of FIG. 5 and the hydrogen radical purge of the present embodiment shown in case (c) of FIG. 5 are as follows.

Reference Example: Processing Conditions of Hydrogen Radical Purge

Supply voltage: radio frequency voltage (frequency of 40 MHz) Power: 200 W

Pressure: 4 Torr (533 Pa)

Present Embodiment: Processing Conditions of Hydrogen Radical Purge

Supply voltage: DC pulse voltage (280 V) Power: 200 W

Pressure: 4 Torr

Film stress of a negative value indicates a film stress of a compressive stress, and film stress of a positive value indicates a film stress of a tensile stress.

The silicon nitride film formed on the substrate W when hydrogen radical purge is not performed, as shown in case (a) of FIG. 5, has a film stress of a tensile stress denoted by "991 MPa." Further, a refractive index (RI), which indicates a film quality, is "1.91." The closer the RI is to "2," the better the film quality.

A comparison will now be made between the film obtained by performing the hydrogen radical purge in the reference example shown in case (b) of FIG. 5 and the film obtained by performing the hydrogen radical purge in the present embodiment shown in case (c) of FIG. 5. The film obtained by performing the hydrogen radical purge of the embodiment shown in case (c) of FIG. 5 has a tensile stress of "924 MPa." Thus, the film stress does not change significantly even after performing the hydrogen radical purge and a tensile stress is maintained. Further, the RI is "1.94," and the film quality is improved by performing the hydrogen radical purge.

These results show that the hydrogen radical purge using the DC pulse voltage is capable of forming a high-quality silicon nitride film having a film stress of a tensile stress. In other words, it may be seen that the high-quality silicon nitride film having the tensile film stress is obtainable at low costs without significantly changing a hardware configuration of the plasma processing apparatus.

In contrast, the film obtained by performing the hydrogen radical purge in the reference example shown in case (b) of FIG. 5 has a film stress of a compressive stress denoted by "−272 MPa," and a direction of the film stress changes significantly as a result of performing the hydrogen radical purge. The RI is "1.95," indicating that the film quality is improved.

In addition, in the case of the silicon nitride film obtained by performing the hydrogen radical purge of the reference example, blister-like film peeling, called blisters, may occur on the film. On the other hand, no blisters occur in the film when the hydrogen radical purge of the embodiment is performed. This phenomenon is also considered to be caused by irradiation of plasma with a high ion energy.

FIG. 6 shows experimental results regarding dependence on a pressure within the processing container 10 and on a power of a DC pulse voltage, in the hydrogen radical purge using the DC pulse voltage according to the present embodiment. Processing conditions for the hydrogen radical purge in the present embodiment shown in cases (a) to (c) of FIG. 6 are as follows.

Present Embodiment: Processing Conditions for Hydrogen Radical Purge in Case (a) of FIG. 6

Supply voltage: DC pulse voltage (310 V) Power: 200 W Pressure: 1.5 Torr (200 Pa)

Present Embodiment: Processing Conditions for Hydrogen Radical Purge in Case (b) of FIG. 6

Supply voltage: DC pulse voltage (280 V) Power: 200 W Pressure: 4 Torr

Present Embodiment: Processing Conditions for Hydrogen Radical Purge in Case (c) of FIG. 6

Supply voltage: DC pulse voltage (380 V) Power: 400 W Pressure: 4 Torr

According to the experimental results, when the hydrogen radical purging is performed under the processing conditions shown in case (a) of FIG. 6, the film has a film stress of a compressive stress denoted by "−208 MPa" and the RI is "1.95," indicating an improved film quality.

When the hydrogen radical purge is performed under the processing conditions shown in case (b) of FIG. 6, the film shows a film stress of a tensile stress of "924 MPa" as the pressure is increased from 1.5 Torr to 4 Torr, compared to case (a) of FIG. 6. Furthermore, the RI is "1.93," indicating an improved film quality.

When the hydrogen radical purge is performed under the processing conditions shown in case (c) of FIG. 6, the film shows a film stress of a tensile stress of "725 MPa" as the power (power of the DC pulse voltage) is doubled, compared to case (b) of FIG. 6. Furthermore, the RI is "1.94," indicating an improved film quality.

In the case of (a) of FIG. 6, the film stress is a compressive stress. However, from the comparison of the experimental results shown in case (a) of FIG. 6 and case (b) of FIG. 6, the film stress may be controlled by changing the pressure under which the hydrogen radical purge is performed. Further, from the comparison of the experimental results shown in case (b) of FIG. 6 and case (c) of FIG. 6, it may be appreciated that the film stress may be controlled by changing the power of the DC pulse voltage. As described above, it may be appreciated that, in the hydrogen radical purge step in the embodiment, the stress of the silicon nitride film is possible to be controlled by at least one selected from the group of a pressure inside the processing container 10 and a power control of the DC pulse voltage.

In addition, from the results shown in case (c) of FIG. 6, since it is possible to maintain the tensile stress when the power of the DC pulse voltage is set to 400 W, there is a possibility that the power of the DC pulse voltage may be increased to even more than 400 W in the hydrogen radical purge step. In such a case, it is considered that film reforming efficiency of the film may be further increased while controlling the stress of the silicon nitride film as the tensile stress.

As described above, according to the nitride film forming method and plasma processing apparatus of the present embodiment, it is possible to reform the silicon nitride film while controlling the film stress of the silicon nitride film.

The nitride film forming method and the plasma processing apparatus according to the embodiment disclosed herein are illustrative in all respects and should not be considered restrictive. The embodiment may be modified and improved in various ways without departing from the spirit of the appended claims. The matters described in the plurality of embodiments described above may be configured in other ways without being inconsistent and may be combined without being inconsistent.

While the embodiment has described the case in which the plasma processing apparatus is a single-wafer type apparatus that processes wafers one by one, the present disclosure is not limited thereto. For example, the plasma processing apparatus may be a multi-wafer film forming apparatus including a plurality of stages in one processing container. In addition, for example, the plasma processing apparatus may be a semi-batch type apparatus that processes wafers by revolving a plurality of wafers placed on a rotary table in the processing container by the rotary table and sequentially passing the wafers through a region to which a first gas is supplied and a region to which a second gas is supplied.

Further, in a plasma processing apparatus that performs plasma processing by loading a wafer boat, in which a plurality of substrates are vertically arranged, into a processing container, there is a device in which plasma is supplied into the processing container from a plasma box communicating with the processing container. In a configuration of this device, the stress of the silicon nitride film does not shift to a compressive stress. It is considered that the reason why the stress of the silicon nitride film does not shift to the compressive stress is because the apparatus has a configuration of a remote plasma type in which a plasma generation region is far from the substrate. Therefore, the nitride film forming method of the present embodiment is suitable when the method is used in a single-wafer film forming apparatus in which the plasma generation region is relatively close to the substrate. The present disclosure is not limited to the single-wafer film forming apparatus that forms a film one by one and may be a multiple-wafer film forming apparatus that simultaneously processes a plurality of substrates arranged horizontally with respect to a loading surface of a stage.

The present application claims priority based on Japanese Patent Application No. 2021-188985 filed in Japanese Patent Office on Nov. 19, 2021, the disclosure of which is incorporated herein in its entirety by reference.

EXPLANATION OF REFERENCE NUMERALS

1: plasma processing apparatus, 2: stage, 10: processing container, 60: upper electrode, 80: variable DC power source, 88: voltage limiter, 100: controller

What is claimed is:

1. A method of forming a nitride film, comprising:

(a) preparing a substrate;

(b) supplying a halogen-containing raw material gas into a processing container;

(c) supplying a nitrogen-containing gas into the processing container, wherein the nitride film is formed by repeating a cycle including (b) and (c) a set number of times; and (d) reforming the nitride film by supplying a hydrogen-containing gas to the processing container to generate a hydrogen radical by a direct current (DC) pulse voltage, between (b) and (c), wherein a plasma processing apparatus includes a first electrode configured to place the substrate in the processing container, a second electrode configured to face the first electrode, a DC power source configured to supply a DC voltage to the second electrode, and a voltage limiter connected to the DC power source, and wherein (d) includes supplying the DC pulse voltage to the second electrode by controlling the DC pulse voltage by control of the voltage limiter such that an overshoot value of a positive voltage is 100 V or less.

2. The method of claim 1, wherein a stress of the nitride film formed by performing (b), (c), and (d) is a tensile stress.

3. The method of claim 1, wherein (d) includes controlling a stress of the nitride film by at least one selected from the group of a pressure within the processing container and a power control of the DC pulse voltage.

4. The method of claim 1, wherein (c) includes generating plasma of the nitrogen-containing gas by supplying a radio frequency voltage, and wherein (d) includes generating the hydrogen radical by supplying the DC pulse voltage.

5. The method of claim 1, wherein (b), (d), and (c) are repeated in this order a set number of times.

* * * * *